United States Patent
Han

(10) Patent No.: US 8,445,350 B2
(45) Date of Patent: May 21, 2013

(54) SEMICONDUCTOR DEVICE AND METHOD OF MANUFACTURING THE SAME

(75) Inventor: Dong Hee Han, Cheongju-si (KR)

(73) Assignee: Hynix Semiconductor, Inc., Icheon (KR)

( * ) Notice: Subject to any disclaimer, the term of this patent is extended or adjusted under 35 U.S.C. 154(b) by 0 days.

(21) Appl. No.: 13/347,081

(22) Filed: Jan. 10, 2012

(65) Prior Publication Data

US 2012/0228678 A1    Sep. 13, 2012

(30) Foreign Application Priority Data

Mar. 11, 2011   (KR) .................. 10-2011-0022001

(51) Int. Cl.
- H01L 21/8249    (2006.01)
- H01L 21/8242    (2006.01)
- H01L 21/8244    (2006.01)
- H01L 21/8246    (2006.01)

(52) U.S. Cl.
USPC ........... 438/296; 438/258; 438/279; 438/589; 257/296; 257/314; 257/E21.645; 257/E21.646; 257/E21.661; 257/E21.662

(58) Field of Classification Search
USPC .......... 438/239, 258, 279, 296, 589; 257/296, 257/314, 510, E21.645, E21.646, E21.661, 257/E21.662
See application file for complete search history.

(56) References Cited

U.S. PATENT DOCUMENTS

| | | | |
|---|---|---|---|
| 5,920,778 A | 7/1999 | Rösner et al. | |
| 6,429,068 B1 * | 8/2002 | Divakaruni et al. | 438/243 |
| 6,727,539 B2 * | 4/2004 | Divakaruni et al. | 257/296 |
| 7,172,939 B1 * | 2/2007 | Chou et al. | 438/257 |
| 7,393,769 B2 * | 7/2008 | Seo et al. | 438/589 |
| 7,592,223 B2 * | 9/2009 | Pham et al. | 438/258 |
| 7,700,441 B2 * | 4/2010 | Kim et al. | 438/270 |
| 7,701,020 B2 * | 4/2010 | Chakihara et al. | 257/401 |
| 7,736,980 B2 * | 6/2010 | Juengling | 438/270 |
| 7,846,825 B2 * | 12/2010 | Kang et al. | 438/586 |
| 7,902,028 B2 * | 3/2011 | Kim et al. | 438/270 |
| 7,915,121 B1 * | 3/2011 | Kim | 438/259 |
| 2002/0190312 A1 * | 12/2002 | Lee | 257/321 |
| 2007/0026606 A1 * | 2/2007 | Chou et al. | 438/257 |
| 2009/0140342 A1 * | 6/2009 | Chakihara et al. | 257/365 |
| 2009/0181529 A1 * | 7/2009 | Kang et al. | 438/586 |
| 2011/0133283 A1 * | 6/2011 | Park et al. | 257/368 |
| 2012/0012911 A1 * | 1/2012 | Jeong | 257/301 |
| 2012/0228678 A1 * | 9/2012 | Han | 257/288 |
| 2012/0273876 A1 * | 11/2012 | Kim | 257/330 |
| 2012/0326267 A1 * | 12/2012 | Song | 257/506 |

FOREIGN PATENT DOCUMENTS

| KR | 10-0374074 B1 | 7/2003 |
|---|---|---|
| KR | 1020100092241 A | 8/2010 |

* cited by examiner

Primary Examiner — M. Wilczewski

(57) ABSTRACT

According to an embodiment of a semiconductor device and a method of manufacturing the same, buried gates are formed in a semiconductor substrate including a cell region and a peripheral region, with the cell region and the peripheral region formed to have a step therebetween. Next, a spacer is formed in a region between the cell region and the peripheral region to block an oxidation path between a gate oxide layer and another insulating layer. Embodiments may reduce damage to active regions and prevent IDD failure because a gate pattern is formed on a guard region provided at a periphery of the cell region.

8 Claims, 3 Drawing Sheets

SEMICONDUCTOR DEVICE AND METHOD OF MANUFACTURING THE SAME

CROSS-REFERENCE TO RELATED APPLICATION

Priority to Korean patent application number 10-2011-0022001, filed on Mar. 11, 2011, which is incorporated by reference in its entirety, is claimed.

BACKGROUND OF THE INVENTION

The present invention relates to a semiconductor device and a method of manufacturing the same.

In general, semiconductor storage devices store information, such as data and program commands, and are generally classified into dynamic random access memory (DRAM) devices and static random access memory (SRAM) devices. A DRAM device is a memory from which data stored therein can be read. Information can be read from and written into a DRAM device, but the information stored in a DRAM device disappears if the information is not periodically re-written into the DRAM device while power is on. As described above, a DRAM device must be continuously refreshed, but is widely used as a high-capacity memory device because it has a low price per memory cell and a high degree of integration.

A metal-oxide semiconductor field effect transistor (hereinafter referred to as an 'MOSFET'), chiefly used in a memory device such as a DRAM device and logical elements, has a structure in which a gate oxide layer, a polysilicon layer, gate metal, and a gate hard mask layer are deposited over a semiconductor substrate and gates are then stacked to form a channel through mask and etch processes.

As the size of a semiconductor device is reduced, the length of a channel is also reduced. As the length of the channel of the semiconductor device is reduced, a short channel effect and a gate-induced drain leakage (GIDL) may occur. Thus, in order to improve the short channel effect and the GIDL characteristic, the length of a gate channel needs to be increased. However, if the gate channel length increases, gate resistance increases, and the GIDL characteristic becomes severe in a region where a gate region and a source/drain region overlap with each other.

FIG. 1 illustrates a cross-sectional view of a conventional semiconductor device.

Referring to FIG. 1, isolation regions (also referred to as "isolation structures") 120 defining active regions 110 are formed in a semiconductor substrate 100 including a cell region 1000a and a peripheral region 1000b.

An interlayer insulating layer 130 is formed over the active regions 110 and the isolation regions 120. After a photoresist layer (not shown) is formed on the interlayer insulating layer 130, photoresist patterns (not shown) are formed by performing exposure and development processes employing buried gates of the cell region 1000a as a mask. The interlayer insulating layer 130, the isolation regions 120, and the active regions 110 are etched by using the photoresist patterns as an etch mask, thereby forming buried gate regions 135 only in the cell region 1000a.

A conductive layer is buried in the buried gate regions 135. Gate electrode patterns 140 are formed in the respective buried gate regions 135 by removing portions of the conductive layer in the buried gate regions 135. Next, a nitride layer 150 is formed over the buried gate regions 135 and the interlayer insulating layer 130.

If a process of forming gate patterns or other patterns is performed on the peripheral region 1000b after the buried gates are formed in the cell region 1000a as described above, an oxidation gas may be introduced through the isolation region 120 between the cell region 1000a and the peripheral region 1000b in an oxidation process of the gate patterns, as indicated by 'A'. Accordingly, agate oxide intensity (GOI) characteristic of the cell region 1000a may be deteriorated because the gate electrode patterns 140 in the cell region 1000a may be oxidized by the oxidation gas introduced thereto.

BRIEF SUMMARY OF THE INVENTION

The present invention provides a method of manufacturing a semiconductor device including forming isolation regions defining active regions in a semiconductor substrate including a cell region and a peripheral region, wherein a guard region is formed between the cell region and the peripheral region, forming buried gate regions by etching the active regions and the isolation regions, forming a conductive material and a first insulating layer in buried gate regions, forming contact plugs in the first insulating layer of the cell region, etching the first insulating layer until the active regions and the isolation regions are exposed by using a mask through which the peripheral region is exposed, so that a step is formed between the cell region and the peripheral region, forming a second insulating layer on an entire surface including the first insulating layer, forming a spacer on the active region between the cell region and the peripheral region by etching the second insulating layer, and forming bit line patterns, coupled to the respective contact plugs in the cell region, and a gate pattern on the guard region of the peripheral region.

The first and the second insulating layers preferably include nitride.

The method preferably further includes forming an interlayer insulating layer over the semiconductor substrate, after forming the isolation regions defining the active regions.

The spacer preferably is formed by using an etch-back process.

The gate pattern formed on the guard region of the peripheral region preferably has a stack structure of a gate oxide layer, a gate electrode layer, and a gate hard mask layer.

The gate pattern on the guard region and the bit line patterns on the contact plugs of the cell region preferably are formed simultaneously.

The gate pattern of the peripheral region preferably is a dummy gate pattern.

The present invention provides a semiconductor device, including isolation regions formed to define active regions in a semiconductor substrate including a cell region and a peripheral region, wherein a guard region is formed between the cell region and the peripheral region, buried gates included in the active regions and the isolation regions of the cell region, a contact plug formed on the active region between the buried gates, a spacer provided on the guard region between the cell region and the peripheral region having a step formed therebetween, and bit line patterns provided on the respective contact plugs of the cell region and a gate pattern provided on the guard region of the peripheral region.

The guard region preferably is provided between the active region and the isolation region.

The gate pattern formed on the guard region of the peripheral region preferably has a stacked structure of a gate oxide layer, a gate electrode layer, and a gate hard mask layer.

The gate pattern formed on the guard region of the peripheral region preferably adjoins the spacer.

The gate pattern provided on the guard region of the peripheral region preferably is a dummy gate pattern.

DESCRIPTION OF EMBODIMENT

The present invention will be described more fully hereinafter with reference to the accompanying drawings, in which an exemplary embodiment of the invention is shown. As those skilled in the art would realize, the described embodiment may be modified in various different ways, all without departing from the spirit or scope of the present invention.

FIGS. 2a to 2d illustrate cross-sectional views of a semiconductor device according to an embodiment of the present invention.

Figure 1:
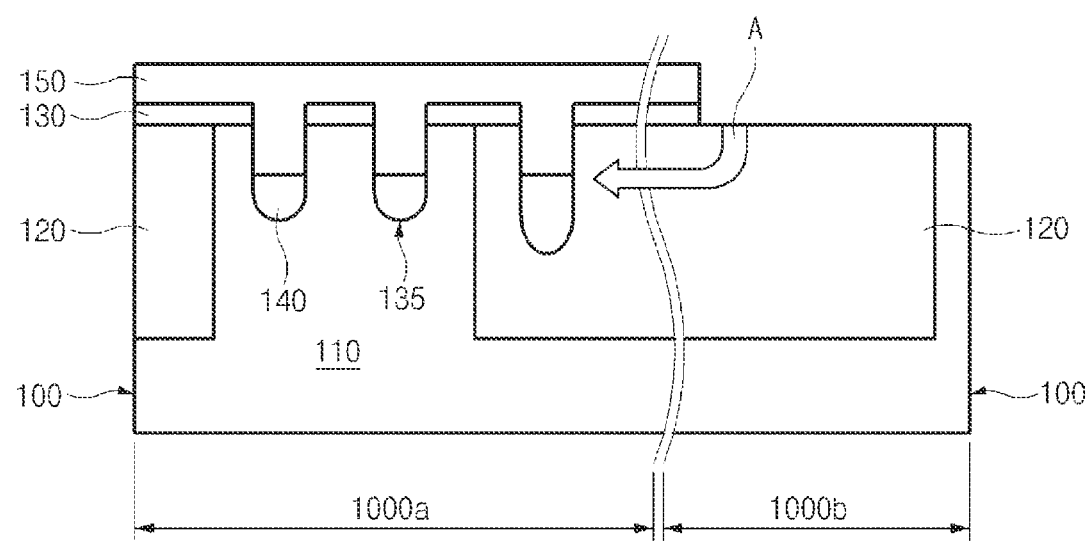
FIG. 1 illustrates a cross-sectional view of a conventional semiconductor device.
Figure 2A:
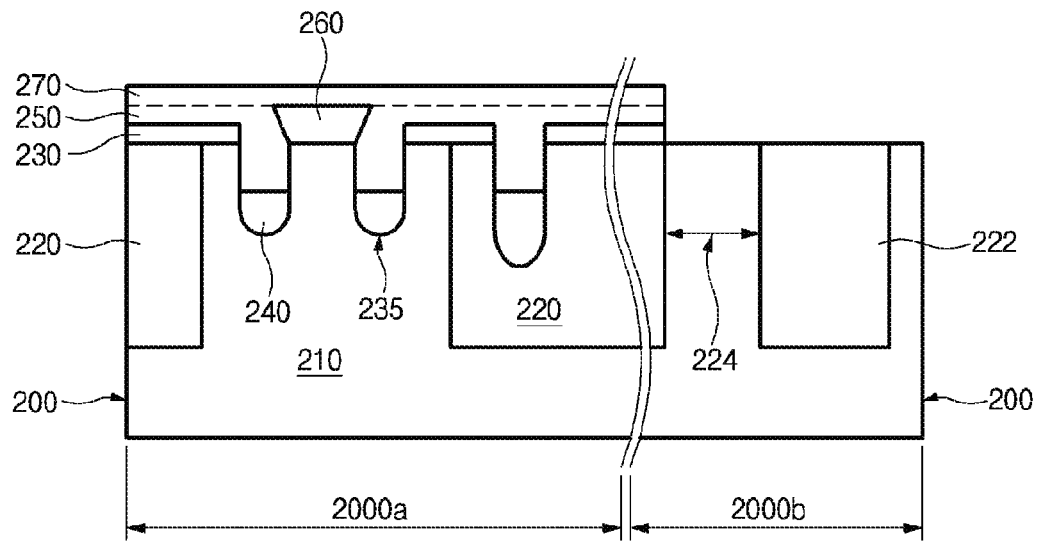
FIGS. 2a to 2d illustrate cross-sectional views of a semiconductor device and a method of manufacturing the same according to an embodiment of the present invention.

Referring to FIG. 2a, isolation regions (also referred to as "isolation structures") 220 defining active regions 210 are formed in a semiconductor substrate 200 including a cell region 2000a and a peripheral region 2000b.

An interlayer insulating layer 230 is formed over the active regions 210 and the isolation regions 220. The interlayer insulating layer 230 may include oxide. After a photoresist layer (not shown) is formed on the interlayer insulating layer 230, photoresist patterns (not shown) are formed by performing exposure and development processes using a mask for forming buried gates in the cell region 2000a. The interlayer insulating layer 230, the isolation regions 220, and the active regions 210 are etched by using the photoresist patterns as an etch mask, thereby forming buried gate regions 235 in the cell region 2000a.

In an embodiment, an isolation region 222 is formed in the peripheral region 2000b. A guard region 224 is defined in the peripheral region 2000b between the isolation region 220 and the isolation region 222. The guard region 224, the isolation region 222 and the isolation regions 220 may be formed at the same time using a etching mask The guard region is also referred to as an "active guard." Accordingly, the guard region 224 may be referred to as an active region, or a guard region formed in an active region, or an active guard region.

A conductive layer is formed in the buried gate regions 235. Gate electrode patterns 240 are formed in the respective buried gate regions 235 by removing or etching back portions of the conductive layer formed in the buried gate regions 235. Next, a first nitride layer 250 is formed over the buried gate regions 235 and the interlayer insulating layer 230.

A photoresist layer (not shown) is formed on the first nitride layer 250, and photoresist patterns (not shown) are formed by performing exposure and development processes using a mask for forming bit line contact plugs. Portions of the first nitride layer 250 and the interlayer insulating layer 230 between the buried gate regions 235 are etched using the photoresist patterns as an etch mask until the active regions 210 are exposed, thereby forming bit line contact holes (not shown).

Bit line contact plugs 260 are formed by filling the bit line contact holes with conductive material. A second nitride layer 270 is formed over the bit line contact plugs 260 and the first nitride layer 250.

Next, portions of the second nitride layer 270, the first nitride layer 250, and the interlayer insulating layer 230 are etched by using a mask until the isolation regions 222 and the guard region 224 are exposed in the peripheral region 2000b, so that a step is formed between the cell region 2000a and the peripheral region 2000b.

Figure 2B:
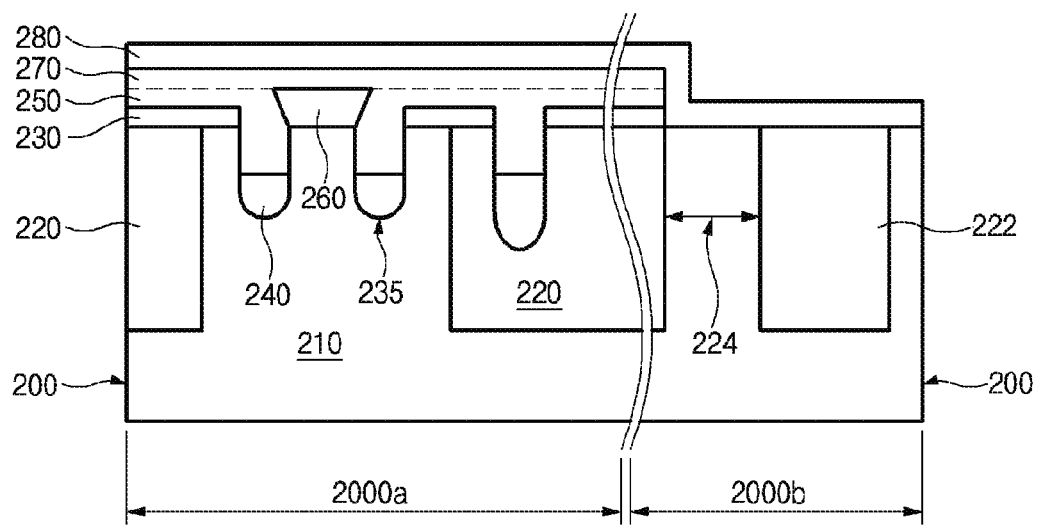

Referring to FIG. 2b, a third nitride layer 280 is deposited over the second nitride layer 270 of the cell region 2000a and the guard region 224 and the isolation region 222 of the peripheral region 2000b.

Figure 2C:
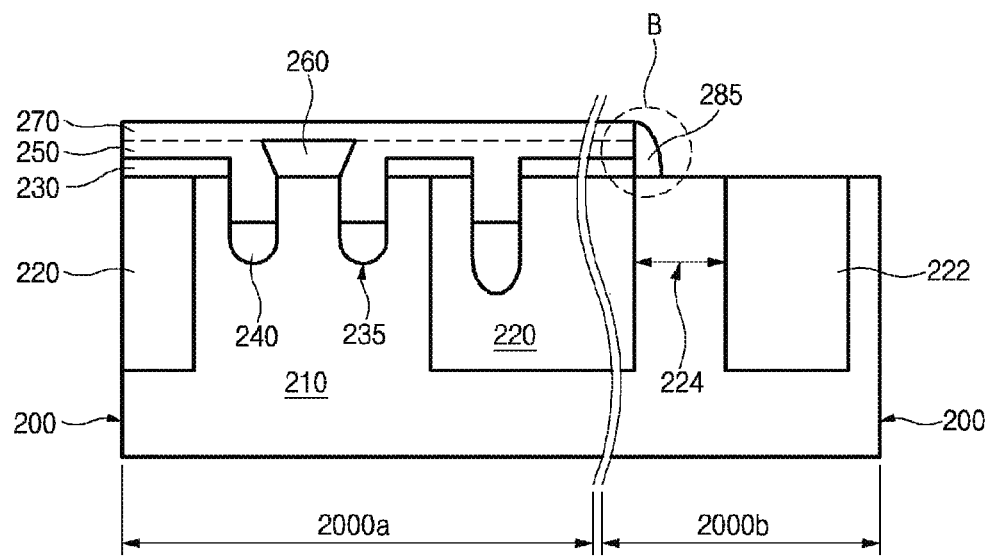

Referring to FIG. 2c, the third nitride layer 280 is etched until the guard region 224 and the isolation regions 220 of the peripheral region 2000b are exposed, thereby forming a spacer 285 on a sidewall of the stacked structure of the interlayer insulating layer 230, the first nitride layer 250, and the second nitride layer 270, which is disposed, as indicated by 'B'. In an embodiment, the spacer 285 is formed on the guard region 224 between the isolation region 220 and the isolation region 224. The third nitride layer 280 may be etched using an etch-back process. In an embodiment, the spacer 285 may be sufficient to block an oxidation path between a gate insulating layer and another insulating layer that may be formed in a subsequent process.

Figure 2D:
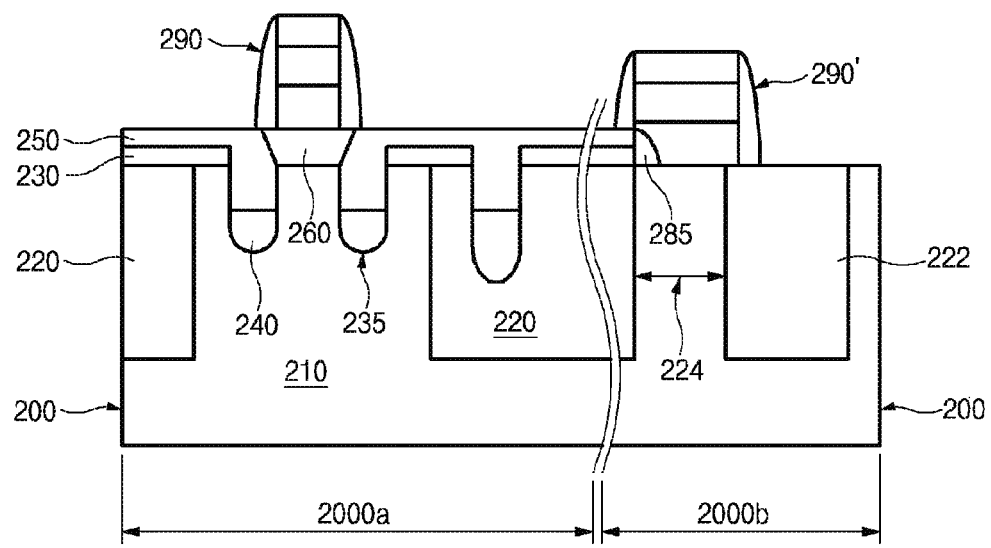

Referring to FIG. 2d, bit line patterns 290 coupled to the respective bit line contact plugs 260 of the cell region 2000a are formed. A gate pattern 290' is formed over the guard region 224 of the peripheral region 2000b so that the gate pattern 290' is formed over and coupled to the spacer 285. In an embodiment, the gate pattern 290' has a planar gate structure so that the conductive portion of the gate pattern 290' are provide over the surface of the guard region 224.

In this embodiment, the bit line patterns 290 in the cell region 2000a and the gate pattern 290' over the guard region 224 in the peripheral region 2000b may be formed at the same time. The gate pattern 290' formed is a dummy gate pattern. In an embodiment, the gate pattern 290' may have a stacked structure including a gate oxide layer, a gate conductive layer, and a gate hard mask layer. Since the gate pattern 290' is formed in the peripheral region 2000b, an Isolation Driven Development (IDD) (current) failure in the guard region 224 may be prevented.

According to an embodiment of the present invention, as described above the buried gates may be formed in the semiconductor substrate including the cell region and the peripheral region, and the cell region and the peripheral region may be formed to have a step therebetween. Next, the spacer is formed on the border between the cell region and the peripheral region.

Accordingly, an oxidation path between a gate oxide layer and another insulating layer is blocked. Furthermore, damage to the active regions can be prevented and an IDD (current) failure can be substantially prevented because the gate pattern is formed over the guard region.

The above embodiments of the present invention are illustrative and not limitative. Various alternatives and equivalents are possible. The invention is not limited by the type of deposition, etching polishing, and patterning steps described herein. Nor is the invention limited to any specific type of a semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method of manufacturing a semiconductor device, the method comprising:

forming isolation regions that define an active region in a semiconductor substrate which includes a cell region and a peripheral region providing a guard region in a portion of the peripheral region that is adjacent to the cell region;

forming buried gate regions by removing portions of the active region;

providing a conductive material within the buried gate regions;

forming a first insulating layer over the conductive material the cell region and the peripheral region;

etching the first insulating layer in the peripheral region until the guard region is exposed, the etched first insulating layer having a sidewall;

forming a second insulating layer over the first insulating layer and the peripheral region ; and etching the second insulating layer to form a spacer on the sidewall of the first insulating layer, the spacer being provided directly over a surface of the guard region.

2. The method according to claim 1, further comprising:
forming a gate pattern over the surface of the guard region, the gate pattern contacting the spacer.

3. The method according to claim 1, further comprising forming an interlayer insulating layer over the semiconductor substrate, after forming the isolation regions defining the active region, wherein the first and the second insulating layers comprise nitride.

4. The method according to claim 1, wherein the sidewall of the etched first insulating layer is provided at a boundary between the isolation region and the guard region.

5. The method according to claim 1, wherein the gate pattern formed over the guard region has a stacked structure of a gate oxide layer, a gate electrode layer, and a gate hard mask layer.

6. The method according to claim 1, further comprising:
forming a contact plug in the first insulating layer of the cell region and over a portion of the active region between the buried gate regions; and
forming a bit line pattern coupled to the contact.

7. The method according to claim 6, wherein the gate pattern formed over the guard region and the bit line patterns formed over the cell region are formed using the same processes.

8. The method according to claim 1, wherein the gate pattern formed over the guard region is a dummy gate pattern.

* * * * *